(12) United States Patent
Wang et al.

(10) Patent No.: US 10,665,147 B2
(45) Date of Patent: May 26, 2020

(54) PHOTOSENSITIVE CIRCUIT, METHOD OF DRIVING PHOTOSENSITIVE CIRCUIT AND DISPLAY DEVICE

(71) Applicant: BOE TECHNOLOGY GROUP CO., LTD., Beijing (CN)

(72) Inventors: Zhiliang Wang, Beijing (CN); Zhanjie Ma, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 71 days.

(21) Appl. No.: 15/953,538

(22) Filed: Apr. 16, 2018

(65) Prior Publication Data

US 2019/0043401 A1 Feb. 7, 2019

(30) Foreign Application Priority Data

Aug. 7, 2017 (CN) .......................... 2017 1 0667066

(51) Int. Cl.
*G09G 3/20* (2006.01)
*H01L 31/113* (2006.01)
(Continued)

(52) U.S. Cl.
CPC ......... *G09G 3/20* (2013.01); *H01L 27/14609* (2013.01); *H01L 31/02322* (2013.01);
(Continued)

(58) Field of Classification Search
None
See application file for complete search history.

(56) References Cited

U.S. PATENT DOCUMENTS 7,580,084 B2 * 8/2009 Yu ....................... G02F 1/13338
345/104
7,800,602 B2 * 9/2010 Choi ....................... G06F 3/042
345/173
(Continued)

FOREIGN PATENT DOCUMENTS

CN 103592791 A 2/2014
CN 105890749 A 8/2016
(Continued)

OTHER PUBLICATIONS

First Office Action for Chinese Patent Application No. 201710667066.X dated Dec. 25, 2018.

*Primary Examiner* — Chad M Dicke
(74) *Attorney, Agent, or Firm* — Calfee, Halter & Griswold LLP (57) ABSTRACT

The present disclosure provides a photosensitive circuit, a method of driving a photosensitive circuit and a display device. The photosensitive circuit includes: a first photosensitive transistor, configured to be turned on in response to a signal of a first node, to transmit a current flowing through the first photosensitive transistor to a second node and generate an induced electrical signal based on an incident light; a second photosensitive transistor, configured to be turned on in response to a first scan signal, to transmit a voltage of the first scan signal to the first node and generate an induced electrical signal based on an incident light; and a first switch, configured to be turned on in response to the first scan signal, to transmit a signal of the second node to a reading terminal. Threshold voltages of both photosensitive transistors are negatively correlated with an intensity of the incident light.

16 Claims, 5 Drawing Sheets

(51) Int. Cl.
    *H01L 31/0232*    (2014.01)
    *H01L 27/146*     (2006.01)
    *H01L 31/032*     (2006.01)
    *H01L 31/0352*    (2006.01)
    *H01L 31/112*     (2006.01)

(52) U.S. Cl.
    CPC .... *H01L 31/032* (2013.01); *H01L 31/035218* (2013.01); *H01L 31/112* (2013.01); *H01L 31/1136* (2013.01); *G09G 2360/144* (2013.01)

(56) References Cited

U.S. PATENT DOCUMENTS

| | | | | |
|---|---|---|---|---|
| 7,940,252 | B2* | 5/2011 | Chuang | G06F 3/042 345/175 |
| 9,972,248 | B2* | 5/2018 | Yang | G09G 3/3233 |
| 10,120,504 | B2* | 11/2018 | Yang | G02F 1/13318 |
| 2006/0132463 | A1* | 6/2006 | Lee | G06F 3/0412 345/173 |
| 2007/0109239 | A1* | 5/2007 | den Boer | G02F 1/13338 345/87 |
| 2010/0026636 | A1* | 2/2010 | Jang | G02F 1/13338 345/173 |
| 2010/0097354 | A1* | 4/2010 | Ahn | G06F 3/0412 345/175 |
| 2011/0001711 | A1* | 1/2011 | Choi | G06F 3/0412 345/173 |
| 2014/0139492 | A1* | 5/2014 | Liu | G06F 3/0412 345/175 |
| 2016/0103513 | A1* | 4/2016 | Yang | G06F 3/041 345/175 |
| 2018/0240405 | A1* | 8/2018 | Li | G09G 3/3233 |
| 2019/0043420 | A1* | 2/2019 | Jung | H01L 27/3234 |

FOREIGN PATENT DOCUMENTS

| | | |
|---|---|---|
| TW | 201224406 A | 6/2012 |
| TW | 201512949 A | 4/2015 |

* cited by examiner

PHOTOSENSITIVE CIRCUIT, METHOD OF DRIVING PHOTOSENSITIVE CIRCUIT AND DISPLAY DEVICE

CROSS REFERENCE

The present application claims the priority of Chinese Patent Application No. 201710667066.X, filed on Aug. 7, 2017, and the entire contents thereof are incorporated herein by reference as part of the present application.

TECHNICAL FIELD

The present disclosure relates to the field of display technology, and in particular, to a photosensitive circuit, a method of driving a photosensitive circuit and a display device.

BACKGROUND

At present, in a photosensitive recognition system, an incident light is detected according to a photosensitive circuit, and the detected incident light is converted into an image for display according to difference of the intensity of the incident light.

It should be noted that, information disclosed in the above background portion is provided only for better understanding of the background of the present disclosure, and thus it may contain information that does not constitute the prior art known by those ordinary skilled in the art.

SUMMARY

According to an aspect of the present disclosure, there is provided a photosensitive circuit, including:

a first photosensitive transistor, configured to be turned on in response to a signal of a first node, to transmit a current flowing through the first photosensitive transistor to a second node and generate an induced electrical signal based on an incident light;

a second photosensitive transistor, configured to be turned on in response to a first scan signal, to transmit a voltage of the first scan signal to the first node and generate an induced electrical signal based on an incident light; and a first switch, configured to be turned on in response to the first scan signal, to transmit a signal of the second node to a reading terminal, wherein threshold voltages of the first photosensitive transistor and the second photosensitive transistor are negatively correlated with an intensity of the incident light.

In an exemplary embodiment of the present disclosure, the first photosensitive transistor has a control terminal coupled to the first node, a first terminal coupled to a power supply signal terminal, and a second terminal coupled to the second node;

the second photosensitive transistor has a control terminal configured to receive the first scan signal, a first terminal configured to receive a reference voltage signal, and a second terminal coupled to the first node; and the first switch has a control terminal configured to receive the first scan signal, a first terminal coupled to the second node, and a second terminal coupled to the reading terminal.

In an exemplary embodiment of the present disclosure, the photosensitive circuit further includes:

a second switch, configured to be turned on in response to a second scan signal, to transmit an initializing signal to the first node.

In an exemplary embodiment of the present disclosure, the second switch has a control terminal configured to receive the second scan signal, a first terminal configured to receive the initializing signal, and a second terminal coupled to the first node.

In an exemplary embodiment of the present disclosure, a plurality of the photosensitive circuits are arranged in N rows, wherein in the case where n∈N, control terminals of all the first switches and the second photosensitive transistors in the $n^{th}$ row and all the second switches in the $(n-1)^{th}$ row are configured to receive the first scan signal;

control terminals of all the second switches in the $n^{th}$ row and all the first switches and the second photosensitive transistors in the $(n+1)^{th}$ row are configured to receive the second scan signal.

In an exemplary embodiment of the present disclosure, a semiconductor layer of the photosensitive transistor includes an indium gallium zinc oxide, and a QD material layer is provided on the indium gallium zinc oxide.

In an exemplary embodiment of the present disclosure, the incident light is an infrared light.

According to an aspect of the present disclosure, there is provided a method of driving a photosensitive circuit, the photosensitive circuit including: a first photosensitive transistor, configured to be turned on in response to a signal of a first node, to transmit a current flowing through the first photosensitive transistor to a second node and generate an induced electrical signal based on an incident light; a second photosensitive transistor, configured to be turned on in response to a first scan signal, to transmit a voltage of the first scan signal to the first node and generate an induced electrical signal based on an incident light; and a first switch, configured to be turned on in response to the first scan signal, to transmit a signal of the second node to a reading terminal, wherein threshold voltages of the first photosensitive transistor and the second photosensitive transistor are negatively correlated with an intensity of the incident light, wherein the method includes:

a reading phase, turning on the first switch and the second photosensitive transistor through the first scan signal to transmit a voltage of the first scan signal to the first node, such that a voltage of the first node becomes a difference value between the voltage of the first scan signal and a threshold voltage of the second photosensitive transistor, a signal of the second node is transmitted to the reading terminal through the first switch, the second photosensitive transistor generates an induced electrical signal in response to an incident light, and the first photosensitive transistor generates an induced electrical signal in response to an incident light.

In an exemplary embodiment of the present disclosure, the photosensitive circuit further includes: a second switch, configured to be turned on in response to a second scan signal, to transmit an initializing signal to the first node;

wherein the method comprises an initializing phase, the second switch being controlled to be turned on by the second scan signal, such that the initializing signal is transmitted to the first node through the second switch, to initialize a voltage of the first node.

According to an aspect of the present disclosure, there is provided a display device, including:

a display panel, including an array substrate and a plurality of data lines for transmitting data signals to the array substrate;

a data driver, configured to supply data signals to the plurality of data lines; and a plurality of photosensitive circuits, electrically connected to the data driver, wherein the photosensitive circuit includes:

a first photosensitive transistor, configured to be turned on in response to a signal of a first node, to transmit a current flowing through the first photosensitive transistor to a second node and generate an induced electrical signal based on an incident light;

a second photosensitive transistor, configured to be turned on in response to a first scan signal, to transmit a voltage of the first scan signal to the first node and generate an induced electrical signal based on an incident light; and a first switch, configured to be turned on in response to the first scan signal, to transmit a signal of the second node to a reading terminal, wherein threshold voltages of the first photosensitive transistor and the second photosensitive transistor are negatively correlated with an intensity of the incident light.

In an exemplary embodiment of the present disclosure, the first photosensitive transistor has a control terminal coupled to the first node, a first terminal coupled to a power supply signal terminal, and a second terminal coupled to the second node;

the second photosensitive transistor has a control terminal configured to receive the first scan signal, a first terminal configured to receive a reference voltage signal, and a second terminal coupled to the first node; and the first switch has a control terminal configured to receive the first scan signal, a first terminal coupled to the second node, and a second terminal coupled to the reading terminal.

In an exemplary embodiment of the present disclosure, the photosensitive circuit further includes:

a second switch, configured to be turned on in response to a second scan signal, to transmit an initializing signal to the first node.

In an exemplary embodiment of the present disclosure, the second switch has a control terminal configured to receive the second scan signal, a first terminal configured to receive the initializing signal, and a second terminal coupled to the first node.

In an exemplary embodiment of the present disclosure, a plurality of the photosensitive circuits are arranged in N rows, wherein in the case where n∈N, control terminals of all the first switches and the second photosensitive transistors in the $n^{th}$ row and all the second switches in the $(n-1)^{th}$ row are configured to receive the first scan signal;

control terminals of all the second switches in the $n^{th}$ row and all the first switches and the second photosensitive transistors in the $(n+1)^{th}$ row are configured to receive the second scan signal.

In an exemplary embodiment of the present disclosure, a semiconductor layer of the photosensitive transistor includes an indium gallium zinc oxide, and a QD material layer is provided on the indium gallium zinc oxide.

In an exemplary embodiment of the present disclosure, the incident light is an infrared light.

It is to be understood that both the foregoing general description and the following detailed description are exemplary and explanatory only and are not restrictive of the present disclosure, as claimed.

This section provides a summary of various implementations or examples of the technology described in the present disclosure, and is not a comprehensive disclosure of the full scope or all features of the disclosed technology.

BRIEF DESCRIPTION OF THE DRAWINGS

The above and other features and advantages of the present disclosure will become more apparent by describing exemplary embodiments thereof in detail with reference to the accompanying drawings. Apparently, the accompanying drawings in the following description show merely some embodiments of the present disclosure, and those skilled in the art may also obtain other drawings from these accompanying drawings without creative efforts. In the drawings.

T1: switch;
T2: photosensitive transistor;
T3: first switch;
T4: second switch;
T5: first photosensitive transistor;
T6: second photosensitive transistor;
N0: node;
N1: first node;
N2: second node;
G0: scan signal;
G1: first scan signal;
G2: second scan signal;
Vini: initializing signal;
VSS: power supply signal terminal;
Vref: reference voltage signal;
OUT: reading terminal; and
Vbias: bias voltage.

DETAILED DESCRIPTION

Example embodiments will now be described more fully with reference to the accompanying drawings. However, the example embodiments may be embodied in many forms and should not be construed as limited to the embodiments set forth herein; rather, these embodiments are provided so that the present disclosure will be thorough and complete, and will fully convey the concepts of the example embodiments to those skilled in the art. The features, structures, or characteristics described herein may be combined in any suitable manner in one or more embodiments. In the following description, numerous specific details are given to provide a thorough understanding of embodiments of the present disclosure. However, those skilled in the art will recognize that the technical solutions of the present disclosure may be practiced without one or more of the specific details, or may adopt other methods, components, materials, devices, steps, and the like. In other instances, well-known technical solutions are not shown or described in detail to avoid obscuring aspects of the present disclosure.

In addition, the drawings are merely schematic representations of the present disclosure and are not necessarily drawn to scale. The same reference numerals in the drawings identify the same or similar parts, and repetitive description thereof will be omitted.

The switches used in all embodiments of the present disclosure may be switch transistors or other devices with alike characteristics, where the switch transistor may be a thin film transistor or a field effect transistor. Since the source electrode and drain electrode of the switch transistor used herein are symmetrical, the source electrode and the drain electrode may be interchanged. In addition, the switch in the present disclosure may be a P-type switch transistor or an N-type switch transistor. The P-type switch transistor is turned on when the gate electrode is at a low level and turned off when the gate electrode is at a high level, and the N-type switch transistor is turned off when the gate electrode is at a low level and turned on when the gate electrode is at a high level.

Photosensitive transistors employed in all embodiments of the present disclosure may be thin film transistors or field effect transistors. The photosensitive transistor includes an N-type photosensitive transistor. The N-type photosensitive transistor is turned off when the gate voltage is at a low level, and turned on when the gate electrode is at a high level.

Figure 1:
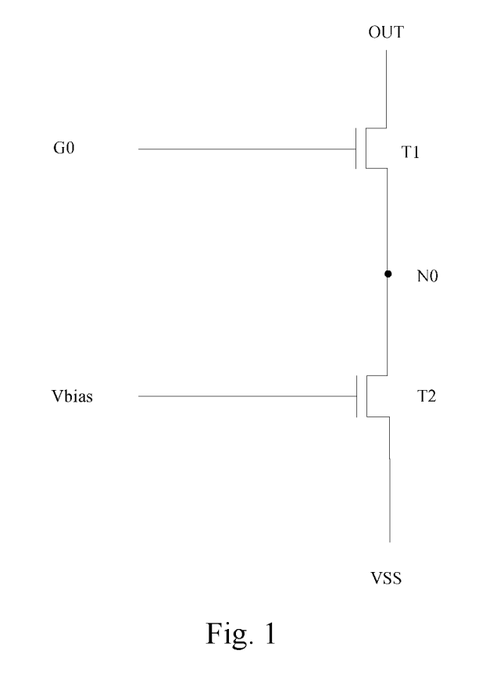
FIG. 1 is a schematic diagram of a photosensitive circuit according to an embodiment.

According to an embodiment, as shown in FIG. 1, the photosensitive circuit includes a switch T1 and a photosensitive transistor T2, wherein the photosensitive transistor T2 may apply an oxide TFT design. An operating process of the photosensitive circuit is as follows. The photosensitive transistor T2 is turned on through a bias voltage Vbias, and thus a current is generated between a source electrode and a drain electrode of the photosensitive transistor T2, and an induced current is generated between the source electrode and the drain electrode of the photosensitive transistor T2 by the incident light. In this case, a current at a node N0 is a sum of the current between the source electrode and the drain electrode of the photosensitive transistor T2 in an ON state and the induced current between the source electrode and the drain electrode of the photosensitive transistor T2 in an illumination state. On the basis of this, the switch T1 is turned on through a scan signal G0, to make a reading terminal read the current of the node N0, that is, to make the reading terminal read a sum of the current between the source electrode and the drain electrode of the photosensitive transistor T2 in an ON state and the induced current between the source electrode and the drain electrode of the photosensitive transistor T2 in an illumination state.

Due to the oxide TFT design adopted by the photosensitive transistor T2, the current between the source electrode and the drain electrode of the photosensitive transistor T2 in an ON state may be small. Therefore, the current of the node N0 may also be small, and the sensitivity of reading the current of the node N0 is reduced.

Figure 2:
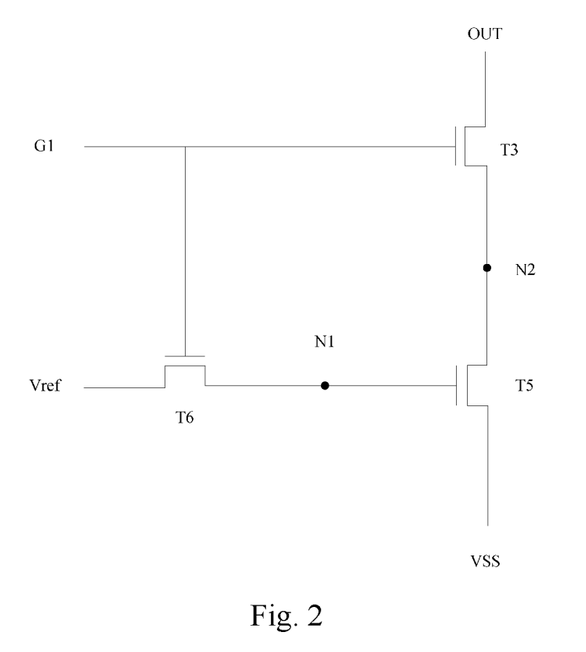
FIG. 2 is a first schematic diagram of a photosensitive circuit provided in an exemplary embodiment of the present disclosure.

The present exemplary embodiment provides a photosensitive circuit, as shown in FIG. 2. The photosensitive circuit may include: a first photosensitive transistor T5, a second photosensitive transistor T6, and a first switch T3.

In the embodiment, the first photosensitive transistor T5 may be configured to be turned on in response to a signal of a first node N1, to transmit a current flowing through the first photosensitive transistor T5 to a second node N2 and generate an induced electrical signal based on an incident light.

The second photosensitive transistor T6 may be configured to be turned on in response to a first scan signal G1, to transmit a voltage of the first scan signal G1 to the first node N1 and generate an induced electrical signal based on an incident light.

The first switch T3 may be configured to be turned on in response to the first scan signal G1, to transmit a signal of the second node N2 to a reading terminal OUT.

In the embodiment, threshold voltages of the first photosensitive transistor T5 and the second photosensitive transistor T6 are negatively correlated with an intensity of the incident light, that is, the threshold voltage becomes smaller as the intensity of the incident light increases, or the threshold voltage becomes larger as the intensity of the incident light decreases.

In the operating process of the photosensitive circuit, on one hand, since the threshold voltage of the first photosensitive transistor T5 is negatively correlated with the intensity of the incident light, the threshold voltage of the first photosensitive transistor T5 is reduced by the incident light, and a driving current of the first photosensitive transistor T5 is amplified, and further the current of the reading terminal OUT is also amplifies, and at the same time, the sensitivity of reading the current by the reading terminal OUT is also improved. On the other hand, the second photosensitive transistor T6 is turned on by the first scan signal G1, so that the voltage of the first node N1 becomes a difference value between the voltage of the first scan signal G1 and the threshold voltage of the second photosensitive transistor T6. Since the threshold voltage of the second photosensitive transistor T6 is negatively correlated with the intensity of the incident light, the threshold voltage of the second photosensitive transistor T6 is reduced by the incident light, to increase the voltage of the first node N1, which further amplifies the driving current of the first photosensitive transistor T5 and thus further amplifies the current of the reading terminal OUT, and at the same time also improves the sensitivity of reading the current by the reading terminal OUT.

As shown in FIG. 2, in the present exemplary embodiment, the first photosensitive transistor T5 has a control terminal coupled to the first node N1, a first terminal coupled to a power supply signal terminal VSS, and a second terminal coupled to the second node N2. The second photosensitive transistor T6 has a control terminal configured to receive the first scan signal G1, a first terminal configured to receive a reference voltage signal Vref, and a second terminal coupled to the first node N1. The first switch T3 has a control terminal configured to receive the first scan signal G1, a first terminal coupled to the second node N2, and a second terminal coupled to the reading terminal OUT.

Figure 3:
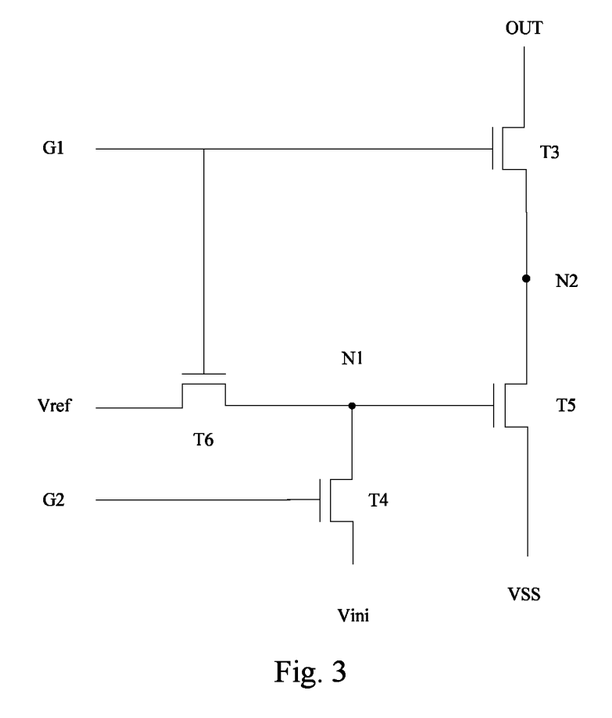
FIG. 3 is a second schematic diagram of a photosensitive circuit provided in an exemplary embodiment of the present disclosure.

On the basis of this, as shown in FIG. 3, the photosensitive circuit may further include: a second switch T4, configured to be turned on in response to a second scan signal G2, to transmit an initializing signal Vini to the first node N1. The second switch has a control terminal configured to receive the second scan signal G2, a first terminal configured to receive the initializing signal Vini, and a second terminal coupled to the first node N1. The voltage of the first node N1 may be initialized through the second switch in combination with the second scan signal G2, to eliminate the influence of a residual signal of a previous frame.

In the present exemplary embodiment, the first switch T3 and the second switch T4 correspond to a first switch transistor and a second switch transistor, and each of the switch transistors has a control terminal, a first terminal and a second terminal. Specifically, the control terminal of each switch transistor may be a gate electrode, the first terminal thereof may be a source electrode, and the second terminal thereof may be a drain electrode. Alternatively, the control terminal of each switch transistor may be a gate electrode, the first terminal thereof may be a drain electrode, and a second terminal thereof may be a source electrode. In addition, each of the switch transistors may be an enhancement type transistor or a depletion type transistor, which is not specially limited in the present exemplary embodiment.

On this basis, both the first switch T3 and the second switch T4 may be N-type thin film transistors. In this case, driving voltages of the first switch T3 and the second switch T4 are both high voltages.

Alternatively, both the first switch T3 and the second switch T4 may be P-type thin film transistors. In this case, the driving voltages of the first switch T3 and the second switch T4 are both low levels.

Based on this, a semiconductor layer of the photosensitive transistor may include an indium gallium zinc oxide, and a QD (quantum dot) material layer is provided on the indium gallium zinc oxide. By providing the QD material layer on the indium gallium zinc oxide, the threshold voltage of the photosensitive transistor may become smaller as the intensity of incident light increases. The incident light may be an infrared light, or may also be an incident light including the infrared light, which is not specifically limited in this exemplary embodiment.

When a plurality of the photosensitive circuits are arranged in N rows, in the case where n∈N, control terminals of all the first switches T3 and the second photosensitive transistors T6 in the $n^{th}$ row and all the second switches T4 in the $(n-1)^{th}$ row are configured to receive the first scan signal G1; and control terminals of all the second switches T4 in the $n^{th}$ row and all the first switches T3 and the second photosensitive transistors T6 in the $(n+1)^{th}$ row are configured to receive the second scan signal G2. For example, four photosensitive circuits are arranged in four rows. The first switch T3 and the second photosensitive transistor T6 in the first row receive the first scan signal G1. The second switch T4 in the first row and the first switch T3 and the second photosensitive transistor T6 in the second row receive the second scan signal G2. The second switch T4 in the second row and the first switch T3 and the second photosensitive transistor T6 in the third row receive the first scan signal G1. The second switch T4 in the third row and all the T3 and the second photosensitive transistors T6 in the fourth row receive the second scan signal G2. All the second switches T4 in the fourth row receive the first scan signal G1. Through the above connection manner, the circuit structure of the photosensitive circuit arranged in an array may be simplified, and the progressive scanning may be achieved.

In an exemplary embodiment of the present disclosure, a method of driving a photosensitive circuit is further provided, which is applied to the photosensitive circuit as shown in FIG. 2.

Figure 4:
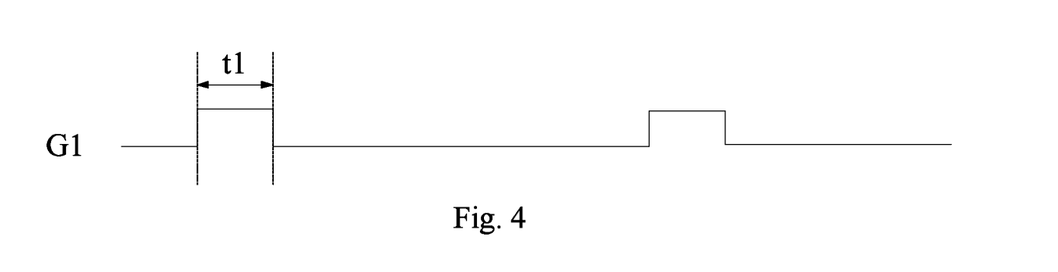
FIG. 4 is a first operating timing diagram of a photosensitive circuit provided in an exemplary embodiment of the present disclosure.

The operating process of the photosensitive circuit shown in FIG. 2 will be described in detail below with reference to the driving timing diagram of the photosensitive circuit shown in FIG. 4. In the following example, all switches are N-type thin film transistors, and all photosensitive transistors are N-type thin film photosensitive transistors. Since all switches are N-type thin film transistors, turn-on levels of all the switches are high levels. Since all the photosensitive transistors are N-type thin-film photosensitive transistors, turn-on levels of all the photosensitive transistors are high levels. The control terminals of all the photosensitive transistors are the gate electrodes of the N-type thin film photosensitive transistors, the first terminals of all the photosensitive transistors are the source electrodes of the N-type thin film photosensitive transistors, and the second terminals of all the photosensitive transistors are the drain electrodes of the N-type thin film photosensitive transistors. The power supply signal terminal VSS outputs a low level. The driving timing of the photosensitive circuit shows the first scan signal G1.

During a reading phase (i.e., the first time period t1), the first switch T3 and the second photosensitive transistor T6 are turned on through the first scan signal G1, a voltage of the first scan signal G1 is transmitted to the first node N1, such that a voltage of the first node N1 becomes a difference value between the voltage of the first scan signal G1 and a threshold voltage of the second photosensitive transistor T6, a signal of the second node N2 is transmitted to the reading terminal OUT through the first switch T3, the second photosensitive transistor T6 generates an induced electrical signal in response to an incident light, and the first photosensitive transistor T5 generates an induced electrical signal in response to an incident light.

In the present exemplary embodiment, the first scan signal G1 is at a high level, and the induced electrical signal includes the induced current between the first terminal and the second terminal of the photosensitive transistor and the portion of the threshold voltage of the photosensitive transistor reduced according to the intensity of the incident light. As shown in FIG. 2, the first switch T3 and the second sensing transistor T6 are turned on, and the voltage of the first node N1 becomes the difference value between the voltage of the first scan signal G1 and the threshold voltage of the second sensing transistor T6. Under driving of the voltage of the first node N1, the first photosensitive transistor T5 is also turned on. At this time, the driving current I of the first photosensitive transistor T5 is calculated as:

$$I=k(Vgs-Vth1)^2=k(Vg-Vs-Vth1)^2,$$

wherein Vgs is the voltage difference between the gate electrode and the source electrode of the first photosensitive transistor T5, Vg is the gate voltage of the first photosensitive transistor T5, Vs is the source voltage of the first photosensitive transistor T5, Vth1 is the threshold voltage of the first photosensitive transistor T5, Vth2 is the threshold voltage of the second photosensitive transistor T6, VG1 is the voltage of the first scan signal G1. Since the voltage of the first node N1 is VG1−Vth2 and the voltage of the first node N1 is the gate voltage Vg of the first photosensitive transistor T5, Vg=VG1−Vth2. Based on this, the calculation formula of the driving current I of the first photosensitive transistor T5 may be expressed as: $I=k(VG1-Vth2-Vs-Vth1)^2$.

Since the first photosensitive transistor T5 generates an induced electrical signal in response to the incident light, that is, generating an induced current Id1 between the first terminal and the second terminal of the first photosensitive transistor and a portion ΔVth1 of the threshold voltage of the photosensitive transistor reduced (the threshold voltage of the first photosensitive transistor T5 being negatively correlated with the intensity of the incident light) according to the intensity of the incident light. Therefore, the driving current of the first photosensitive transistor T5 is $I=k(VG1-Vth2-Vs-(Vth1-\Delta Vth1))^2$. Obviously, since the threshold voltage of the first photosensitive transistor T5 becomes smaller, the driving current of the first photosensitive transistor T5 is amplified.

Similarly, since the second photosensitive transistor T6 generates an induced electrical signal in response to the incident light, that is, generating the induced current Id2 between the first terminal and the second terminal of the second photosensitive transistor and the portion $\Delta Vth2$ of the threshold voltage of the photosensitive transistor reduced (the threshold voltage of the second photosensitive transistor T6 being negatively correlated with the intensity of the incident light) according to the intensity of the incident light. Therefore, the driving current of the first photosensitive transistor T5 is $I=k(VG1-(Vth2-\Delta Vth2)-Vs-(Vth1-\Delta Vth1))^2$. Obviously, since the threshold voltage of the second photosensitive transistor T6 becomes smaller, the driving current of the first photosensitive transistor T5 is amplified.

In this case, since the driving current of the first photosensitive transistor T5 is increased, the current between the first terminal and the second terminal of the first photosensitive transistor T5 in the turn-on state becomes larger. Since the current read by the reading terminal OUT includes the current between the first terminal and the second terminal of the first photosensitive transistor T5 in the turn-on state and the induced current Id1 generated between the first terminal and the second terminal in response to the incident light and since the current between the first terminal and the second terminal of the first photosensitive transistor T5 in the turn-on state becomes larger, the current read by the reading terminal OUT become larger, thereby improving the sensitivity of reading the current by the reading terminal OUT.

Based on this, as shown in FIG. 3, the photosensitive circuit may further include: a second switch T4, configured to be turned on in response to a second scan signal G2, to transmit an initializing signal Vini to the first node N1. The operating process of the photosensitive circuit shown in FIG. 3 will be described in detail below with reference to the driving timing diagram of the photosensitive circuit shown in FIG. 5. In this example, all switches are N-type thin film transistors, and all photosensitive transistors are N-type thin film photosensitive transistors. Since all switches are N-type thin film transistors, turn-on levels of all the switches are high levels. Since all the photosensitive transistors are N-type thin-film photosensitive transistors, turn-on levels of all the photosensitive transistors are high levels. The control terminals of all the photosensitive transistors are the gate electrodes of the N-type thin film photosensitive transistors, the first terminals of all the photosensitive transistors are the source electrodes of the N-type thin film photosensitive transistors, and the second terminals of all the photosensitive transistors are the drain electrodes of the N-type thin film photosensitive transistors. The power supply signal terminal VSS outputs a low level. The driving timing of the photosensitive circuit shows the first scan signal G1 and the second scan signal G2.

Figure 6:
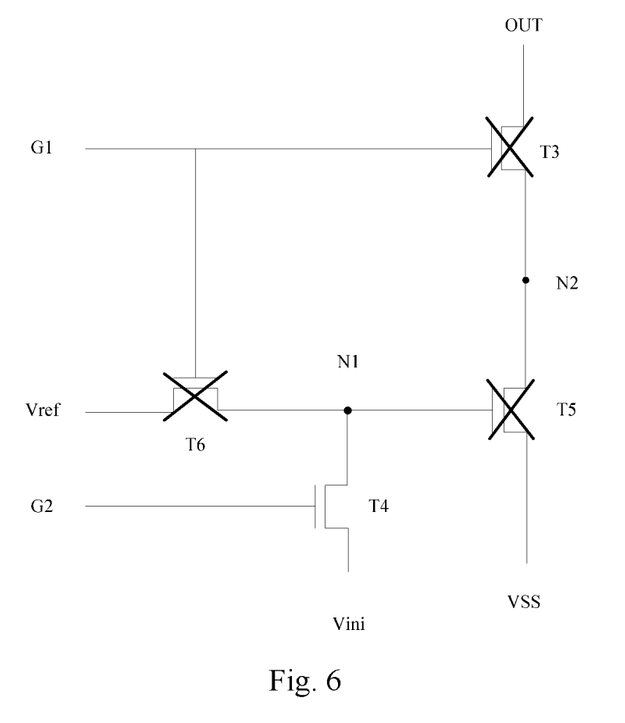
FIG. 6 is an equivalent circuit diagram of a photosensitive circuit in an initializing phase provided in an exemplary embodiment of the present disclosure.

During an initializing phase (i.e., the second time period t2), the second switch T4 is controlled to be turned on by the second scan signal G2, so that the initializing signal Vini is transmitted to the first node N1 through the second switch T4, to initialize the voltage of the first node N1. In the present exemplary embodiment, the first scan signal G1 is at a low level and the second scan signal G2 is at a high level. As shown in FIG. 6, the first switch T3, the second photosensitive transistor T6 and the first photosensitive transistor T5 are turned off, and the second switch T4 is turned on. The initializing signal Vini is transmitted to the first node N1 through the second switch T4, to initialize the voltage (the control terminal of the first photosensitive transistor T5) of the first node N1, so as to eliminate the influence of the residual signal of the previous frame.

Figure 7:
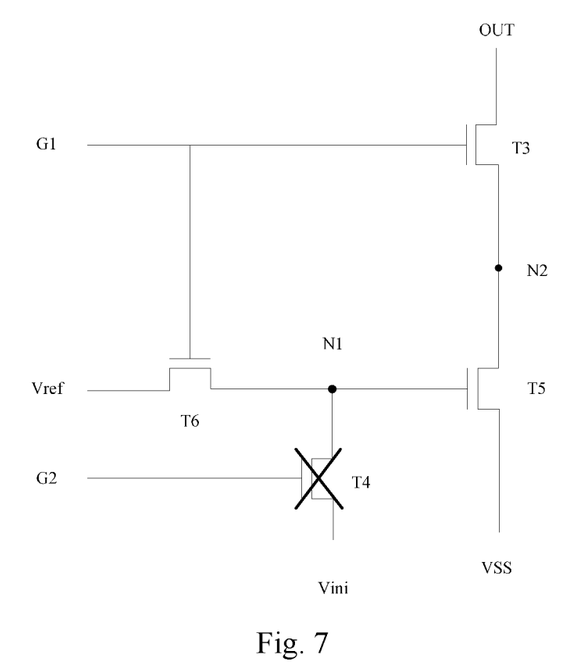
FIG. 7 is an equivalent circuit diagram of a photosensitive circuit in a reading phase provided in an exemplary embodiment of the present disclosure.

During a reading phase (i.e., the first time period t1), the first switch T3 and the second photosensitive transistor T6 are turned on through the first scan signal G1, a voltage of the first scan signal G1 is transmitted to the first node N1, such that a voltage of the first node N1 becomes a difference value between the voltage of the first scan signal G1 and a threshold voltage of the second photosensitive transistor T6, a signal of the second node N2 is transmitted to the reading terminal OUT through the first switch T3, the second photosensitive transistor T6 generates an induced electrical signal in response to an incident light, and the first photosensitive transistor T5 generates an induced electrical signal in response to an incident light.

In the present exemplary embodiment, the first scan signal G1 is at a high level and the second scan signal G2 is at a low level. As shown in FIG. 7, the first switch T3 and the second sensing transistor T6 are turned on, and the voltage of the first node N1 becomes the difference value between the voltage of the first scan signal G1 and the threshold voltage of the second sensing transistor T6. Under driving of the voltage of the first node N1, the first photosensitive transistor T5 is turned on and the second transistor T4 is turned off. Since the second switch T4 is turned off, the circuit in the reading phase herein is substantially the same as the circuit in the reading phase in FIG. 2, which will not be repeated herein since the driving process of the circuit in the reading phase in FIG. 2 has been described in detail.

Figure 5:
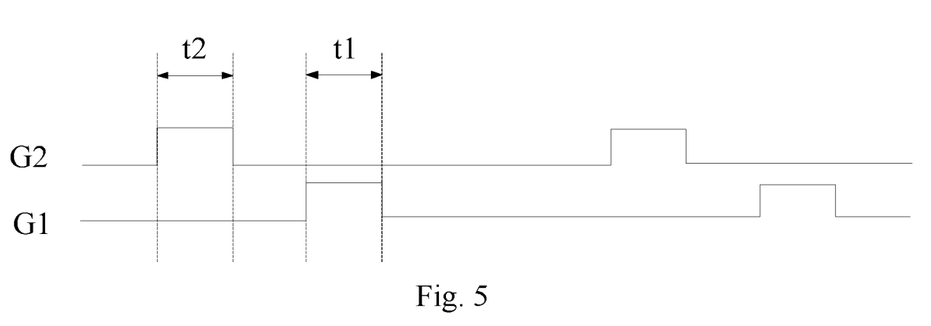
FIG. 5 is a second operating timing diagram of a photosensitive circuit provided in an exemplary embodiment of the present disclosure.

It should be noted that, when different signals are jumping simultaneously, different signals may affect each other. In order to eliminate the above phenomenon, as shown in FIG. 5, there may be a holding phase between the initializing phase (i.e., the second time period t2) and the reading phase (i.e., the first time period t1), to allow different signals to jump at different times.

It should be noted that, in the above specific embodiments, all the switches are N-type thin film transistors. However, those skilled in the art can readily obtain all the switches being P-type thin film transistors according to the photosensitive circuit provided by the present disclosure. In an exemplary embodiment of the present disclosure, all the switches are P-type thin film transistors. Since all the switches are P-type thin film transistors, the turn-on levels of all the switches are low levels. Of course, the photosensitive circuit provided by the present disclosure may also be replaced by a CMOS (Complementary Metal Oxide Semiconductor) circuit or the like, which is not limited to the photosensitive circuit provided by the present embodiment, and details will not be described herein again.

The present exemplary embodiment further provides a display device, which may include: a display panel, including an array substrate and a plurality of data lines for transmitting data signals to the array substrate; a data driver, configured to supply data signals to the plurality of data lines; and a plurality of any one of photosensitive circuits, electrically connected to the data driver. In the embodiment, for example, the display device may include any product or component having a display function, such as a cell phone, a tablet computer, a notebook computer, a digital photo frame, and the like. It should be noted that, specific details of each module unit in the display device have been described in detail in the corresponding photosensitive circuit, and thus details are not described herein again.

The exemplary embodiment of the present disclosure provides a photosensitive circuit, a method of driving a photosensitive circuit and a display device. The photosensitive circuit includes a first photosensitive transistor, a second photosensitive transistor and a first switch, wherein threshold voltages of the first photosensitive transistor and the second photosensitive transistor are negatively correlated with an intensity of the incident light. In the operating process of the photosensitive circuit, on one hand, since the threshold voltage of the first photosensitive transistor is negatively correlated with the intensity of the incident light, the threshold voltage of the first photosensitive transistor is reduced by the incident light, and a driving current of the first photosensitive transistor is amplified, and further the current of the reading terminal is also amplifies, and at the same time, the sensitivity of reading the current by the reading terminal is also improved. On the other hand, the second photosensitive transistor is turned on by the first scan signal, so that the voltage of the first node becomes a difference value between the voltage of the first scan signal and the threshold voltage of the second photosensitive transistor. Since the threshold voltage of the second photosensitive transistor is negatively correlated with the intensity of the incident light, the threshold voltage of the second photosensitive transistor is reduced by the incident light, to increase the voltage of the first node, which further amplifies the driving current of the first photosensitive transistor and thus further amplifies the current of the reading terminal, and at the same time also improves the sensitivity of reading the current by the reading terminal.

It should be noted that, although several modules or units of the device for action execution are mentioned above in detail, this division is not mandatory. In fact, according to the embodiments of the present disclosure, the features and functions of two or more modules or units described above may be embodied in one module or unit. Conversely, the features and functions of one module or unit described above may be further divided into a plurality of modules or units to be employed.

In addition, although various steps of the methods of the present disclosure are described in the drawings in a particular order, this does not require or imply that the steps must be performed in that particular order, or does not require or imply that all of the illustrated steps must be performed to achieve the desired result. Additionally or alternatively, certain steps may be omitted, a plurality of steps may be combined into one step, and/or one step may be divided into a plurality of steps to perform.

Other embodiments of the present disclosure will readily occur to those skilled in the art upon consideration of the specification and practice of the invention disclosed herein. The present application is intended to cover any variations, uses, or adaptations of the present disclosure that follow general principles of the present disclosure and include common knowledge or conventional technical means in the art which are not disclosed herein. The specification and embodiments are considered as exemplary only, with the true scope and spirit of the present disclosure being indicated by the appending claims.

What is claimed is:

1. A photosensitive circuit, comprising:
    a first photosensitive transistor, configured to be turned on in response to a signal of a first node, to transmit a current flowing through the first photosensitive transistor to a second node and generate an induced electrical signal based on an incident light;
    a second photosensitive transistor, configured to be turned on in response to a first scan signal, to transmit a difference value between a voltage of the first scan signal and a threshold voltage of the second photosensitive transistor to the first node and generate an induced electrical signal based on an incident light; and
    a first switch, configured to be turned on in response to the first scan signal, to transmit a signal of the second node to a reading terminal,
    wherein a threshold voltage of the first photosensitive transistor and the threshold voltage of the second photosensitive transistor are negatively correlated with an intensity of the incident light.

2. The photosensitive circuit according to claim 1, wherein
    the first photosensitive transistor comprises a control terminal coupled to the first node, a first terminal coupled to a power supply signal terminal, and a second terminal coupled to the second node;
    the second photosensitive transistor comprises a control terminal configured to receive the first scan signal, a first terminal configured to receive a reference voltage signal, and a second terminal coupled to the first node; and
    the first switch comprises a control terminal configured to receive the first scan signal, a first terminal coupled to the second node, and a second terminal coupled to the reading terminal.

3. The photosensitive circuit according to claim 1, further comprising:
    a second switch, configured to be turned on in response to a second scan signal, to transmit an initializing signal to the first node.

4. The photosensitive circuit according to claim 3, wherein the second switch comprises a control terminal configured to receive the second scan signal, a first terminal configured to receive the initializing signal, and a second terminal coupled to the first node.

5. The photosensitive circuit according to claim 4, wherein a plurality of the photosensitive circuits are arranged in N rows, wherein in the case where n∈N,
    control terminals of all the first switches and the second photosensitive transistors in the $n^{th}$ row and all the second switches in the $(n-1)^{th}$ row are configured to receive the first scan signal;
    control terminals of all the second switches in the $n^{th}$ row and all the first switches and the second photosensitive transistors in the $(n+1)^{th}$ row are configured to receive the second scan signal.

6. The photosensitive circuit according to claim 1, wherein
    a semiconductor layer of the photosensitive transistor comprises an indium gallium zinc oxide, and a QD material layer is provided on the indium gallium zinc oxide.

7. The photosensitive circuit according to claim 1, wherein the incident light is an infrared light.

8. A method of driving a photosensitive circuit, the photosensitive circuit comprising:
    a first photosensitive transistor, configured to be turned on in response to a signal of a first node, to transmit a current flowing through the first photosensitive transistor to a second node and generate an induced electrical signal based on an incident light;
    a second photosensitive transistor, configured to be turned on in response to a first scan signal, to transmit a difference value between a voltage of the first scan signal and a threshold voltage of the second photosensitive transistor to the first node and generate an induced electrical signal based on an incident light; and a first switch, configured to be turned on in response to the first scan signal, to transmit a signal of the second node to a reading terminal, wherein a threshold voltage of the first photosensitive transistor and the threshold voltage of the second photosensitive transistor are negatively correlated with an intensity of the incident light, wherein the method comprises:

in a reading phase, turning on the first switch and the second photosensitive transistor through the first scan signal, such that a voltage of the first node becomes the difference value between the voltage of the first scan signal and the threshold voltage of the second photosensitive transistor, a signal of the second node is transmitted to the reading terminal through the first switch, the second photosensitive transistor generates an induced electrical signal in response to an incident light, and the first photosensitive transistor generates an induced electrical signal in response to an incident light.

9. The method of driving a photosensitive circuit according to claim 8, wherein the photosensitive circuit further comprises: a second switch, configured to be turned on in response to a second scan signal, to transmit an initializing signal to the first node;

wherein the method comprises in an initializing phase, the second switch being controlled to be turned on by the second scan signal, such that the initializing signal is transmitted to the first node through the second switch, to initialize a voltage of the first node.

10. A display device, comprising:

a display panel, comprising an array substrate and a plurality of data lines for transmitting data signals to the array substrate;

a data driver, configured to supply data signals to the plurality of data lines; and a plurality of photosensitive circuits, electrically connected to the data driver, wherein the photosensitive circuit comprises:

a first photosensitive transistor, configured to be turned on in response to a signal of a first node, to transmit a current flowing through the first photosensitive transistor to a second node and generate an induced electrical signal based on an incident light;

a second photosensitive transistor, configured to be turned on in response to a first scan signal, to transmit a difference value between a voltage of the first scan signal and a threshold voltage of the second photosensitive transistor to the first node and generate an induced electrical signal based on an incident light; and a first switch, configured to be turned on in response to the first scan signal, to transmit a signal of the second node to a reading terminal, wherein a threshold voltage of the first photosensitive transistor and the threshold voltage of the second photosensitive transistor are negatively correlated with an intensity of the incident light.

11. The display device according to claim 10, wherein the first photosensitive transistor comprises a control terminal coupled to the first node, a first terminal coupled to a power supply signal terminal, and a second terminal coupled to the second node;

the second photosensitive transistor comprises a control terminal configured to receive the first scan signal, a first terminal configured to receive a reference voltage signal, and a second terminal coupled to the first node; and the first switch comprises a control terminal configured to receive the first scan signal, a first terminal coupled to the second node, and a second terminal coupled to the reading terminal.

12. The display device according to claim 10, wherein the photosensitive circuit further comprises:

a second switch, configured to be turned on in response to a second scan signal, to transmit an initializing signal to the first node.

13. The display device according to claim 12, wherein the second switch comprises a control terminal configured to receive the second scan signal, a first terminal configured to receive the initializing signal, and a second terminal coupled to the first node.

14. The display device according to claim 13, wherein a plurality of the photosensitive circuits are arranged in N rows, wherein in the case where $n \in N$, control terminals of all the first switches and the second photosensitive transistors in the $n^{th}$ row and all the second switches in the $(n-1)^{th}$ row are configured to receive the first scan signal;

control terminals of all the second switches in the $n^{th}$ row and all the first switches and the second photosensitive transistors in the $(n+1)^{th}$ row are configured to receive the second scan signal.

15. The display device according to claim 10, wherein a semiconductor layer of the photosensitive transistor comprises an indium gallium zinc oxide, and a QD material layer is provided on the indium gallium zinc oxide.

16. The display device according to claim 10, wherein the incident light is an infrared light.

* * * * *